(12) United States Patent
Wu et al.

(10) Patent No.: US 10,861,972 B2
(45) Date of Patent: Dec. 8, 2020

(54) CHANNEL STRAIN INDUCING ARCHITECTURE AND DOPING TECHNIQUE AT REPLACEMENT POLY GATE (RPG) STAGE

(71) Applicant: Taiwan Semiconductor Manufacturing Co., Ltd., Hsin-Chu (TW)

(72) Inventors: Zhiqiang Wu, Chubei (TW); Yi-Ming Sheu, Hsinchu (TW); Tzer-Min Shen, Hsinchu (TW); Chun-Fu Cheng, Zhubei (TW); Hong-Shen Chen, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/390,373

(22) Filed: Apr. 22, 2019

(65) Prior Publication Data

US 2019/0245089 A1 Aug. 8, 2019

Related U.S. Application Data

(60) Continuation of application No. 15/247,024, filed on Aug. 25, 2016, now Pat. No. 10,276,717, which is a
(Continued)

(51) Int. Cl.
*H01L 29/78* (2006.01)
*H01L 29/08* (2006.01)
(Continued)

(52) U.S. Cl.
CPC .... *H01L 29/7848* (2013.01); *H01L 21/26586* (2013.01); *H01L 29/0615* (2013.01);
(Continued)

(58) Field of Classification Search
None
See application file for complete search history.

(56) References Cited

U.S. PATENT DOCUMENTS 6,033,963 A 3/2000 Huang et al.
7,115,945 B2 10/2006 Lee et al.
(Continued)

OTHER PUBLICATIONS

Non-Final Office Action dated Oct. 8, 2015 for U.S. Appl. No. 14/100,263.
(Continued)

*Primary Examiner* — Robert K Carpenter
(74) *Attorney, Agent, or Firm* — Eschweiler & Potashnik, LLC

(57) ABSTRACT

The demand for increased performance and shrinking geometry from ICs has brought the introduction of multi-gate devices including finFET devices. Inducing a higher tensile strain/stress in a region provides for enhanced electron mobility, which may improve performance. High temperature processes during device fabrication tend to relax the stress on these strain inducing layers. In some embodiments, the present disclosure relates to a finFET device and its formation. A strain-inducing layer is disposed on a semiconductor fin between a channel region and a metal gate electrode. First and second inner spacers are disposed on a top surface of the strain-inducing layer and have inner sidewalls disposed along outer sidewalls of the metal gate electrode. First and second outer spacers have innermost sidewalls disposed along outer sidewalls of the first and second inner spacers, respectively. The first and second outer spacers cover outer sidewalls of the first and second inner spacers.

20 Claims, 13 Drawing Sheets

Related U.S. Application Data division of application No. 14/100,263, filed on Dec. 9, 2013, now Pat. No. 9,455,346.

(51) Int. Cl.
  *H01L 29/06* (2006.01)
  *H01L 29/66* (2006.01)
  *H01L 29/10* (2006.01)
  *H01L 21/265* (2006.01)

(52) U.S. Cl.
  CPC ...... *H01L 29/0649* (2013.01); *H01L 29/0847* (2013.01); *H01L 29/1054* (2013.01); *H01L 29/6656* (2013.01); *H01L 29/66545* (2013.01); *H01L 29/66598* (2013.01); *H01L 29/66636* (2013.01); *H01L 29/66795* (2013.01); *H01L 29/785* (2013.01); *H01L 29/7833* (2013.01); *H01L 29/7843* (2013.01); *H01L 29/7851* (2013.01)

(56) References Cited

U.S. PATENT DOCUMENTS

| | | | |
|---|---|---|---|
| 8,647,937 | B2 | 2/2014 | Toh et al. |
| 10,276,717 | B2 * | 4/2019 | Wu ................. H01L 29/7848 |
| 2005/0233525 | A1 | 10/2005 | Yeo et al. |
| 2011/0024804 | A1 | 2/2011 | Chang et al. |
| 2011/0031538 | A1 | 2/2011 | Hsieh et al. |
| 2012/0104509 | A1 | 5/2012 | Matsumoto |
| 2012/0261754 | A1 | 10/2012 | Cheng et al. |
| 2013/0078772 | A1 | 3/2013 | Yuan et al. |
| 2013/0082275 | A1 | 4/2013 | Dube et al. |

OTHER PUBLICATIONS

Notice of Allowance dated May 26, 2016 for U.S. Appl. No. 14/100,263.
Non-Final Office Action dated Jul. 16, 2018 for U.S. Appl. No. 15/247,024.
Notice of Allowance dated Feb. 15, 2019 for U.S. Appl. No. 15/247,024.

* cited by examiner

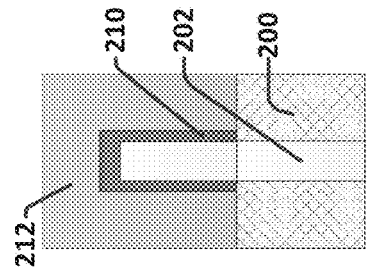
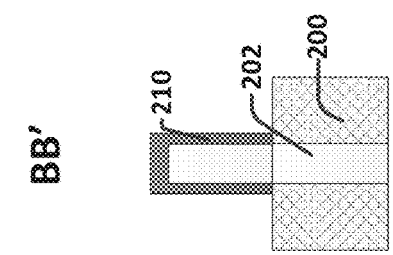
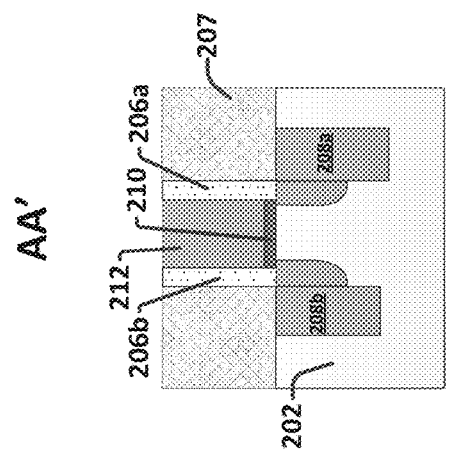
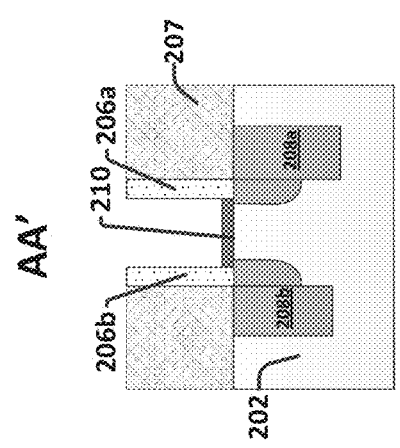
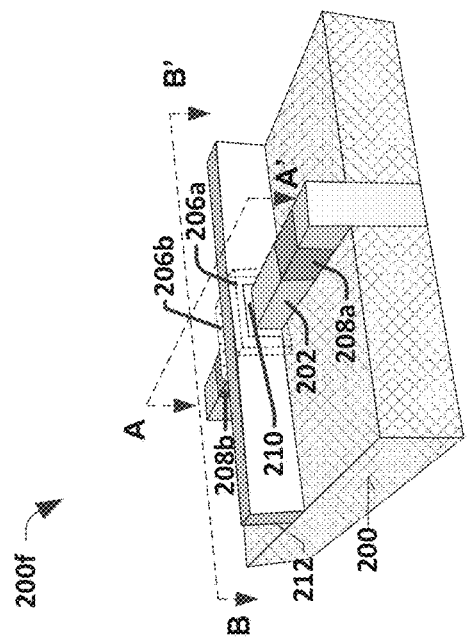
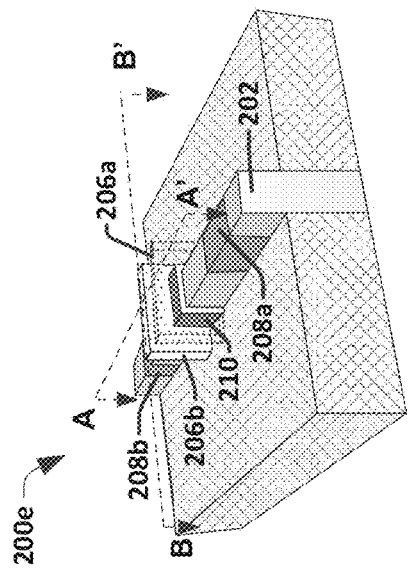
FIG. 2E
FIG. 2F

CHANNEL STRAIN INDUCING ARCHITECTURE AND DOPING TECHNIQUE AT REPLACEMENT POLY GATE (RPG) STAGE

REFERENCE TO RELATED APPLICATIONS

This application is a Continuation of U.S. application Ser. No. 15/247,024, filed on Aug. 25, 2016, which is a Divisional of U.S. application Ser. No. 14/100,263, filed on Dec. 9, 2013 (now U.S. Pat. No. 9,455,346, issued on Sep. 27, 2016). The contents of the above-referenced patent applications are hereby incorporated by reference in their entirety.

BACKGROUND

With the scaling of integrated circuits, more devices are put into a chip. This not only requires the shrinkage of the device size, but it also requires an improvement in the manufacturing techniques. Fin field-effect transistors (Fin FETs) have increased drive currents and hence faster switching speed over planar transistors. As devices continue to get smaller, precise control of gate lengths also becomes critical to assure performance. Strain engineering is employed in semiconductor manufacturing to enhance device performance. Performance benefits are achieved by modulating strain in the transistor channel, which enhances electron mobility (or hole mobility) and thereby conductivity through the channel.

BRIEF DESCRIPTION OF THE DRAWINGS

FIGS. 2A-2F illustrate 3-dimensional images of some embodiments of the present disclosure and their corresponding cross sections along two perpendicular directions.

DETAILED DESCRIPTION

Figure 1:
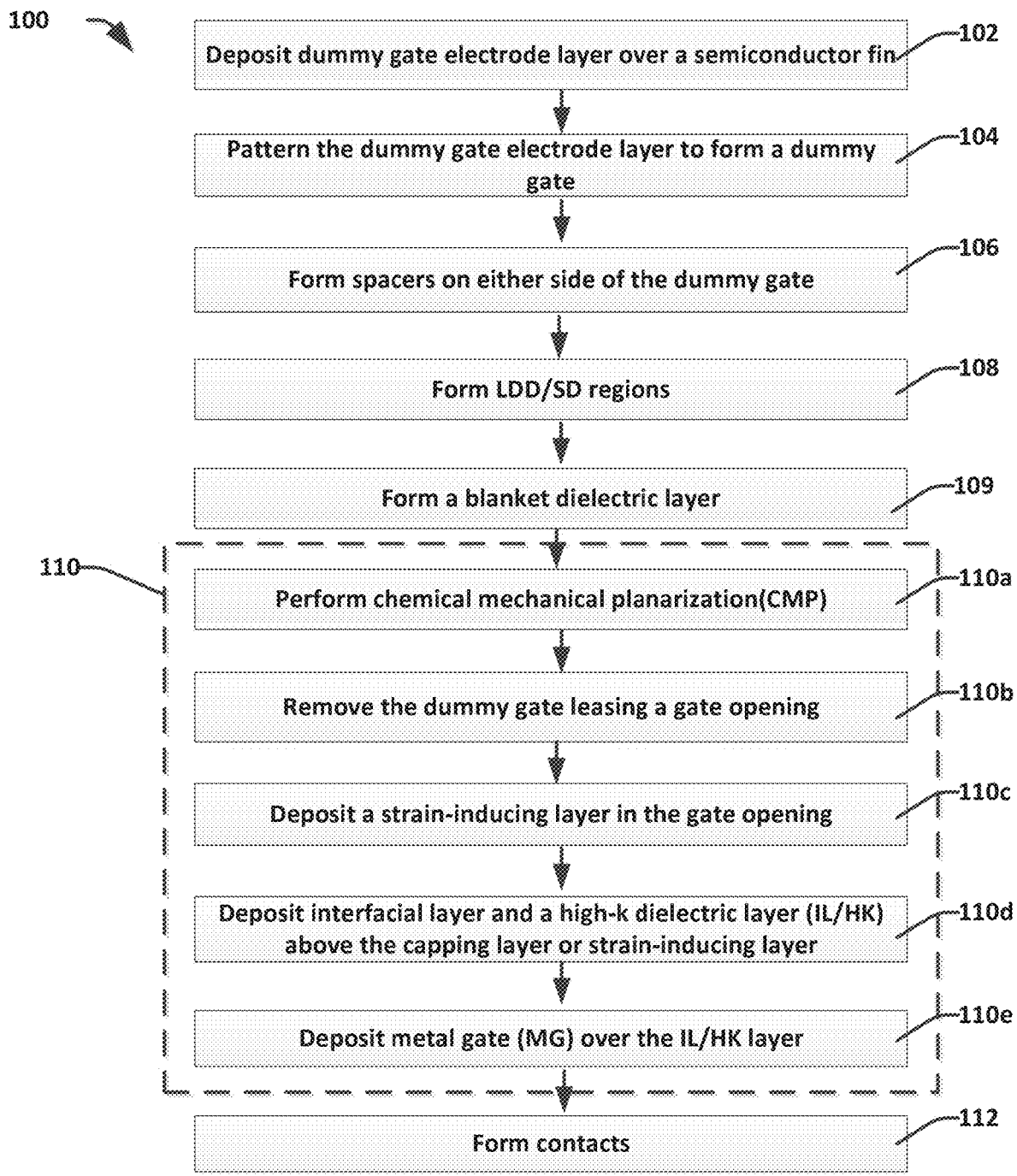
FIG. 1 illustrates a flow diagram of some embodiments of a method for forming a strain-inducing layer over a transistor channel at a replacement poly-silicon gate (RPG) stage of a fin field-effect transistor (finFET) formation process.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Strain engineering is employed in semiconductor manufacturing to enhance device performance. Strained silicon is a layer of silicon in which the silicon atoms are stretched beyond their normal inter atomic distance. This can be accomplished by putting the layer of silicon over a substrate of silicon germanium (SiGe), for example. As the atoms in the silicon layer align with the atoms of the underlying silicon germanium layer, which are arranged farther apart with respect to those of a bulk silicon crystal, the links between the silicon atoms become stretched thereby leading to strained silicon. At the atomic level, it is easier for carriers to pass through on appropriately strained lattice compared to an unstrained lattice, leading to faster switching times for transistor.

In CMOS technologies, PMOS and NMOS respond differently to different types of strain. Specifically, PMOS performance is best served by applying compressive strain to the channel, whereas NMOS receives benefit from tensile strain. SiGe ($Si_{1-x}Ge_x$), consisting of any molar ratio of silicon and germanium, is commonly used as a semiconductor material in integrated circuits (ICs) as a strain-inducing layer for strained silicon in CMOS transistors. The larger lattice constant of the SiGe film provides uniaxial strain to the Si channel. The higher the Ge concentration, the larger the strain and thus better performance. However, sequential processes and thermal steps during the formation of a field effect transistor tend to relax the stress of the strain-inducing layer and constrain upper limit of Ge concentration. Doping the SiGe strain-inducing or cap layer is not a flexible option to boost the device performance.

Accordingly, the present disclosure relates to a method of forming a SiGe strain-inducing layer or cap layer at a later stage of formation of a fin field effect transistor (finFET) device, specifically at a replacement polysilicon gate (RPG) stage of an RPG process, so that a higher Ge concentration can be utilized which leads to better carrier confinement and greater doping flexibility. An RPG process helps in controlling gate length and preventing metal migration during elevated temperature operations. In an RPG process, a dummy gate is formed of silicon dioxide or a polymer such as photoresist. After the high temperature processes involved in device formation are completed, the dummy gate is removed leaving a gate opening and the desired gate material is deposited in to the gate opening.

FIG. 1 illustrates a flow diagram of some embodiments of a method 100 for forming a strain-inducing layer over a transistor channel at a replacement poly-silicon gate (RPG) stage of a fin field-effect transistor (finFET) formation process.

While disclosed method 100 (and other methods described herein) is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 102, a dummy gate electrode layer is formed over a semiconductor fin. In some embodiments, the dummy gate electrode layer is composed of poly silicon having a thickness ranging from approximately 100 nm to 300 nm.

At 104, the dummy gate electrode layer is patterned using photolithography and anisotropically etched to form a dummy gate having sidewalls.

At 106, spacers are formed on either side of the dummy gate. In some embodiments, the spacers are preferably composed of silicon dioxide ($SiO_2$), silicon oxynitride ($Si_x O_y N_z$), composite ($SiO_2/Si_3 N_4$), or most preferably silicon nitride ($Si_3 N_4$). They can be formed by a blanket deposition and isotropic etch back. The spacers preferably have a thickness ranging between 1 nm and 5 nm.

At 108, impurity ions are implanted into the fin structure to form highly doped source and drain regions and/or lightly doped source and drain extensions using the dummy gate as an implant mask.

At 109, a blanket dielectric layer is formed over the dummy gate and the substrate structure.

Reference numeral 110 represents some embodiments of the replacement gate stage of the RPG process.

At 110a, the blanket dielectric layer is planarized using a chemical mechanical polishing (CMP) process.

At 110b, the dummy gate is removed, thereby forming a gate opening.

At 110c, a strain-inducing layer is deposited in the gate opening covering the channel. In some embodiments, the strain-inducing layer comprises SiGe.

At 110d, an interfacial layer and a high-k dielectric are deposited over the strain-inducing layer or capping layer.

At 110e, metal gate electrode layer is formed in the gate opening. The gate electrode layer is planarized to form a metal gate, stopping on the blanket dielectric layer.

At 112 metal contacts are formed at the desired positions over the device. In some embodiments contacts are formed at the source and drain regions by patterning the blanket dielectric layer to form contact openings and filling the contact openings with conductive plugs. The conductive plugs are preferably composed of tungsten. A metal layer is formed over the blanket dielectric layer and the conductive plugs and patterned to form device interconnections.

FIGS. 2a-2e illustrate 3-dimensional (3D) images of some embodiments of the present disclosure and their corresponding cross sections along two perpendicular directions.

Figure 2A:
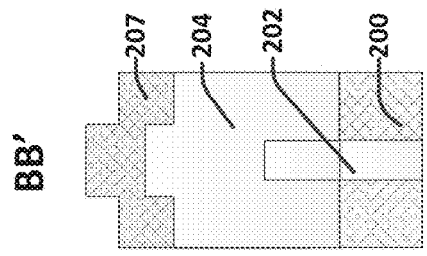
Figure 2A:
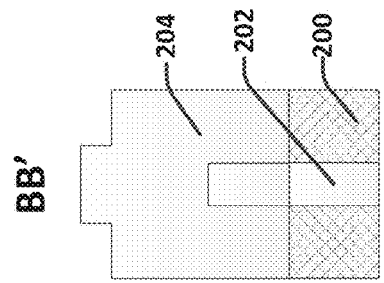
Figure 2A:
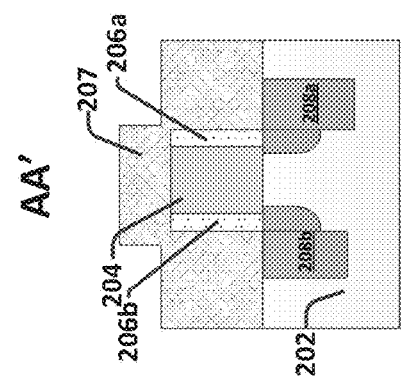
Figure 2A:
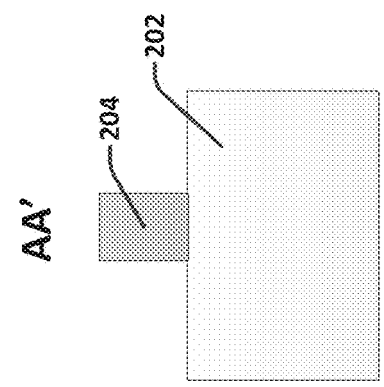
Figure 2A:
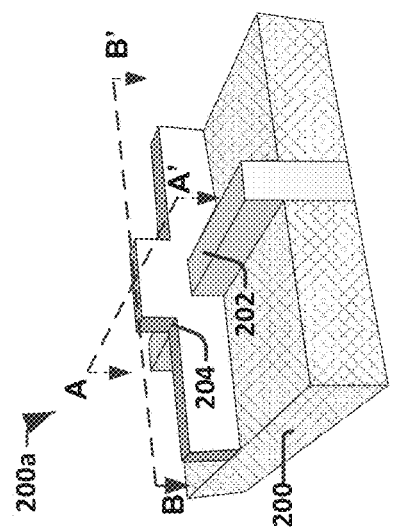

FIG. 2a illustrates a 3D view 200a of an embodiment of a finFET device comprising a dummy gate over a semiconductor fin. A semiconductor body 200 has a semiconductor fin 202 disposed along a first direction. The semiconductor body 200 comprises alternating zones of active regions (for e.g. silicon) and isolation regions (for e.g. oxide). A dummy gate 204 comprising polysilicon is disposed in a second direction (which is perpendicular to the first direction) over the semiconductor fin 202 at a location that is approximately the midpoint of the fin 202. In some embodiments a dummy gate oxide layer (not shown) is deposited along the second direction before depositing the dummy gate electrode layer over it. The dummy gate oxide layer can be formed by chemical vapor deposition or more preferably can be thermally grown. The dummy gate oxide layer is preferably formed to a thickness of between about 2 nm and 30 nm. FIG. 2a also shows cross sections along plane AA' and BB' of 200a.

Figure 2B:
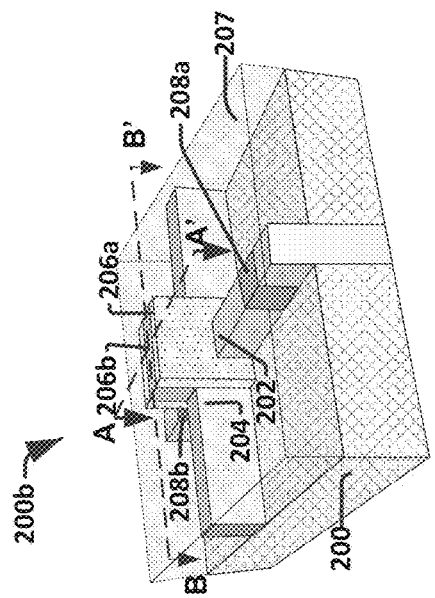

FIG. 2b illustrates a 3D view 200b of an embodiment of a finFET device comprising spacers 206a and 206b on either side of a dummy gate 204 and dopants diffused inside the fin. In some embodiments, the spacers 206a and 206b are preferably composed of silicon dioxide ($SiO_2$), silicon oxynitride ($Si_x O_y N_z$), composite ($SiO_2/Si_3 N_4$), or most preferably silicon nitride ($Si_3 N_4$). Impurity ions are implanted into the fin structure to form highly doped source region 208a and drain region 208b and lightly doped source and drain extentions (not shown). In some embodiments for an N-type device, the implanted ions can be As or P. A blanket dielectric layer 207 is formed entirely over substrate structure. Cross sections along plane AA' and BB' of 200b are also shown.

Figure 2C:
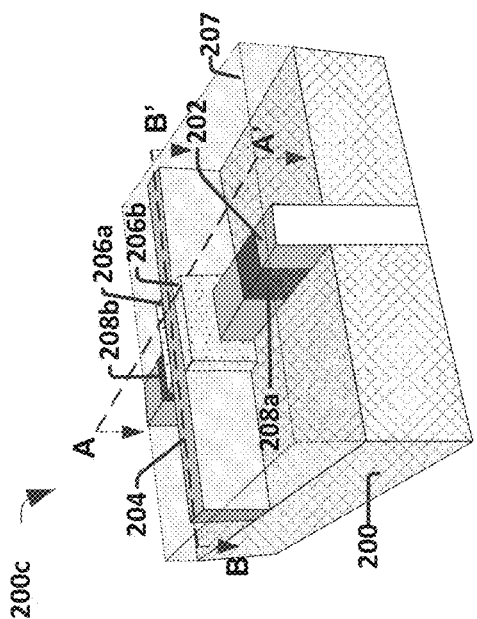
Figure 2C:
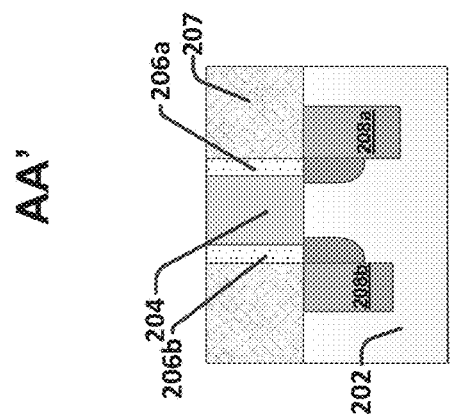
Figure 2C:
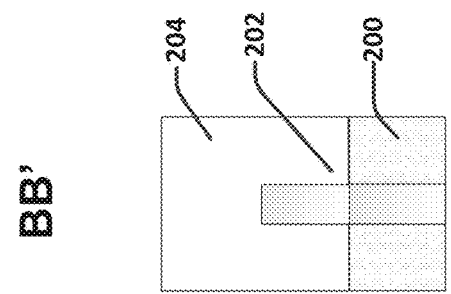

FIG. 2c illustrates a 3D view 200c of an embodiment of a finFET device after a planarizing step. Here, the blanket dielectric layer 207 the dummy gate 204, and the spacers 206a and 206b are planarized using a chemical mechanical polishing (CMP) process. Cross sections along plane AA' and BB' of 200c are also illustrated.

It is duly specified that from the next image onwards, the blanket dielectric layer 207 is not shown in the 3D images to provide clarity to other features.

Figure 2D:
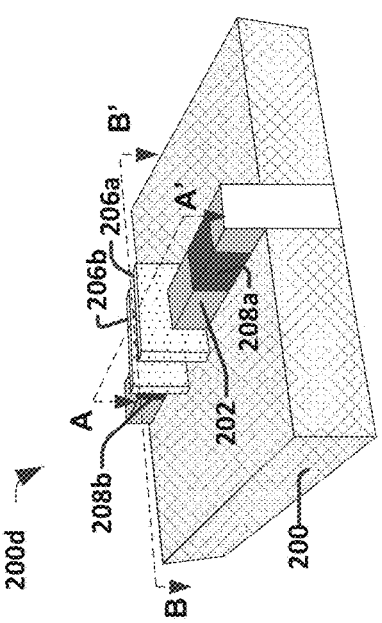
Figure 2D:
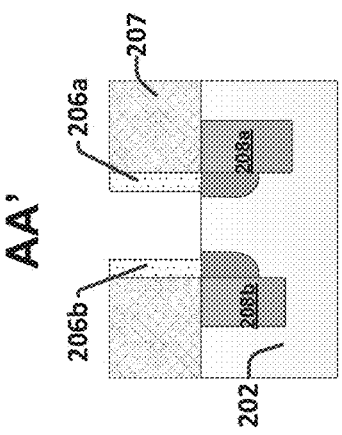
Figure 2D:
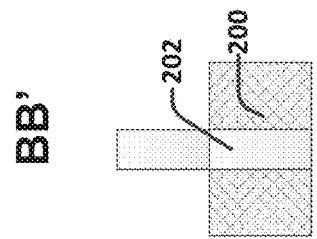

FIG. 2d illustrates a 3D view 200d of an embodiment of a finFET device wherein the dummy gate 204 has been removed leaving a gate opening. In some embodiments, the dummy gate 204 is removed using a selective etch such as a plasma etch using chlorine as a reactant to etch the polysilicon of the dummy gate electrode 204 selectively to the silicon dioxide of the blanket dielectric layer 207. The dummy gate oxide (not shown) can be removed in-situ using a $CHF_3/CF_4$ etch chemistry, thereby exposing the substrate structure in the gate opening. Cross sections along plane AA' and BB' of 200d are also shown.

FIG. 2e illustrates a 3D view 200e of an embodiment of a finFET device after depositing a strain-inducing layer or cap layer 210 in the gate opening. In some embodiments, the strain-inducing layer comprises SiGe. In this figure, spacer 206a is made transparent to get a clear view of the strain inducing layer 210 over the channel. Cross sections along plane AA' and BB' of 200e are also shown.

FIG. 2f illustrates a 3D view 200f of an embodiment of a finFET device after the deposition of a gate stack 212 over the strain inducing layer 210 in the gate opening. In some embodiments, the gate stack 212 comprises an interfacial layer, a high-k dielectric layer and a gate electrode. Here again, spacer 206a is made transparent to get a clear view of the gate stack 212 and the strain inducing layer 210. Also, cross sections along plane AA' and BB' of 200e are also shown.

Accordingly, as the strain-inducing layer 210 is deposited after the elevated temperature processes or after removing the dummy gate 204 in the RPG process, better carrier confinement and doping flexibility is achieved. Forming the gate stack 212 comprising the metal gate after the high temperature processes, prevents metal migration.

Figure 3:
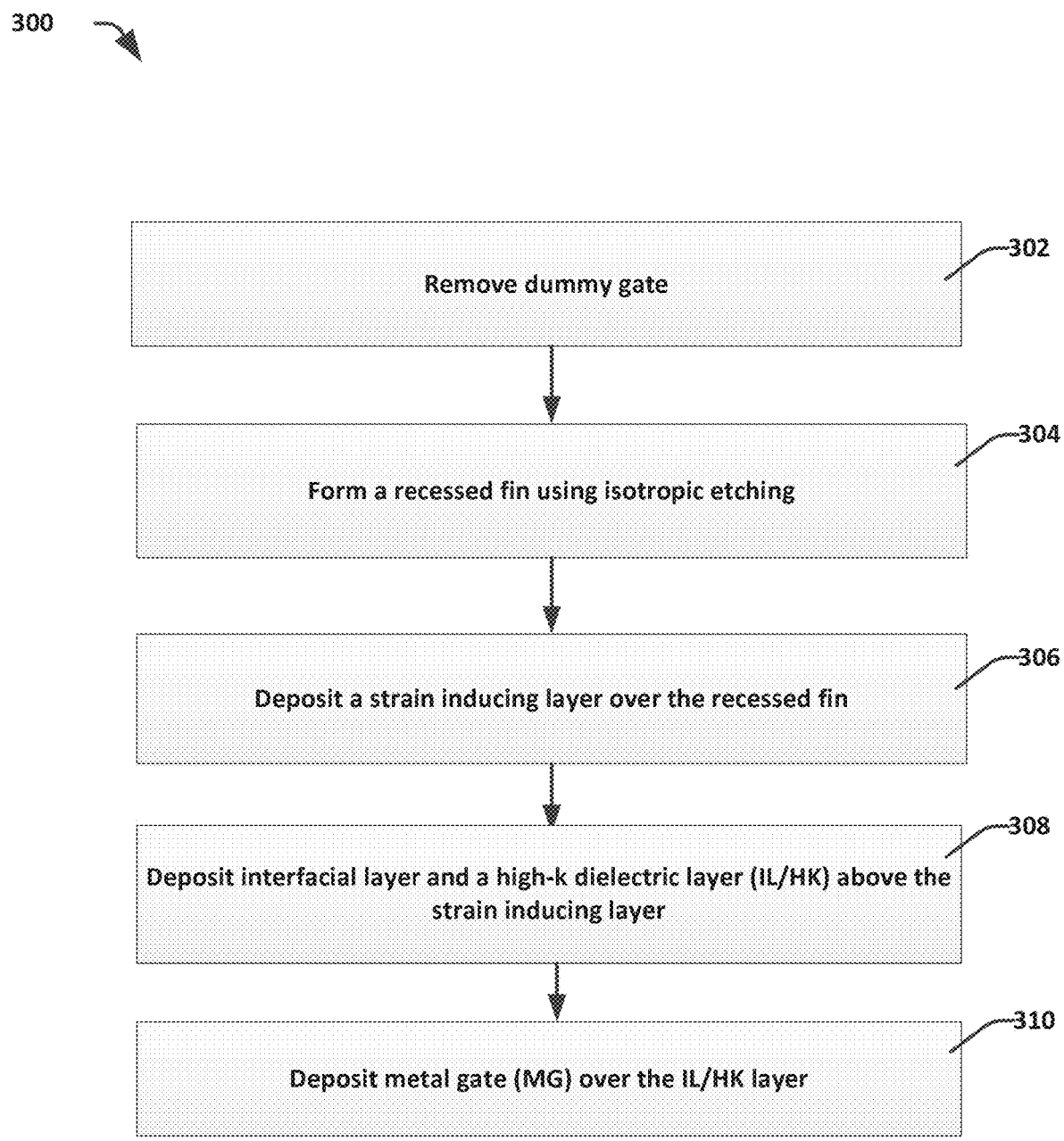
FIG. 3 illustrates a flow diagram of some embodiments of a method for forming a strain-inducing layer over a recessed fin of a finFET device.

FIG. 3 illustrates a flow diagram of some embodiments of a method 300 for forming a strain-inducing layer over a recessed fin of a finFET device. Method 300 corresponds to step 110b of method 100 in the RPG stage process flow.

At 302, a dummy gate is removed forming a gate opening.

At 304, semiconductor fin in the gate region is recessed using isotropic etching. A recessed fin provides effective stress to the fin channel and enhances device performance.

In some embodiments, the recess may be etched using suitable etching technology such as dry etching, plasma etching, wet etching, etc. In another embodiment, one or more photolithography processes are used to form masking elements such that the remaining regions of the substrate are protected from the etching process.

At 306, a strain inducing layer is formed over the recessed fin in the gate opening.

At 308, an interfacial layer (IL) and a high-k dielectric layer (HK) are deposited above the strain inducing or capping layer.

At 310, a metal gate (MG) is deposited over the high-k dielectric layer forming a gate electrode.

Figure 4A:
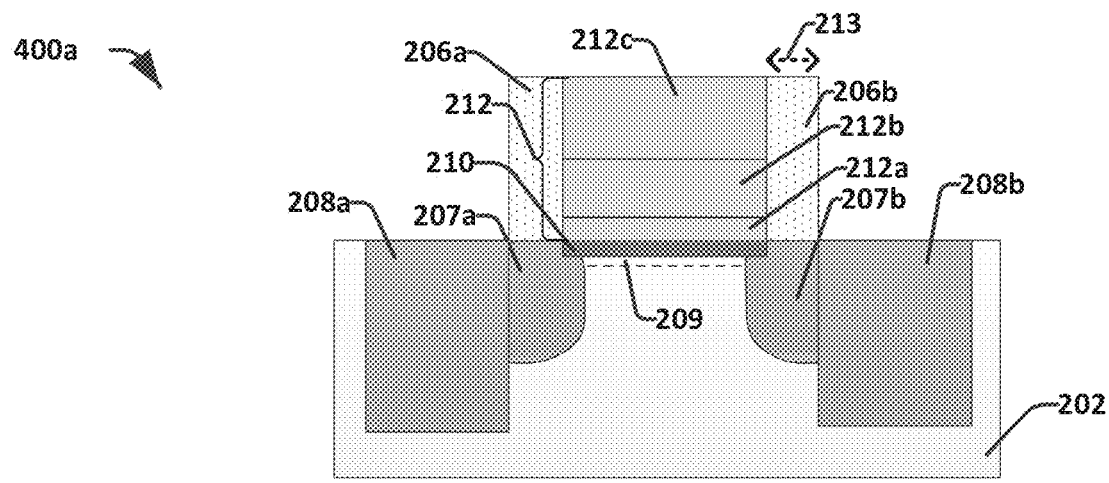
FIGS. 4A and 4B illustrate cross sectional images along two perpendicular planes of a finFET device comprising a strain-inducing layer over a recessed fin.
Figure 4B:
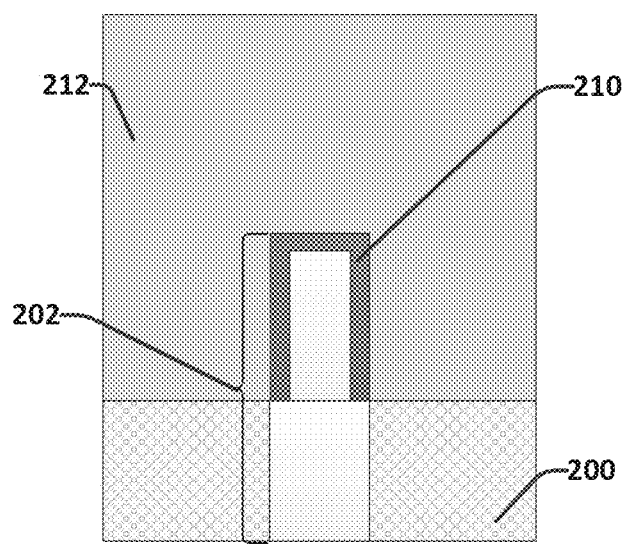

FIGS. 4a and 4b illustrate cross sectional images along two perpendicular planes of a finFET device comprising a strain-inducing layer over a recessed fin.

It is duly specified that, in all the following cross sectional images, the blanket dielectric layer 207 is not shown for clarity and simplicity.

FIG. 4a illustrates a cross sectional image 400a of a finfet device formed according to method 300. The cross section is along a plane which is parallel to the fin 202 and passes through the center of it (e.g. plane A-A' in FIG. 2f). Semiconductor fin 202 is recessed in the gate region making the strain inducing layer 210 reside above and close to channel 209 but below the level of a bottom surface of side wall spacers 206a and 206b. A gate stack 212 resides above the strain inducing layer 210. The gate stack comprises an interfacial layer 212a, a high-k dielectric layer 212b above the interfacial layer 212a and a gate metal 212c above the high-k dielectric layer 212b. In some embodiments spacers 206a and 206b may be doped or un-doped. Doping the spacers would reduce the dielectric constant of gate spacers, and hence reduce the external resistance between the source and the drain regions. In some embodiments, the side wall spacers are subjected to dopants like Boron [B] at a concentration ranging from approximately 1e20 $cm^{-3}$ to 1e22 $cm^{-3}$. The width 213 of the spacers 206a and 206b range from approximately 1 nm to 5 nm. Within the fin, lightly doped source and drain (LDD) regions 207a and 207b or highly doped source and drain extensions 208a and 208b are present.

FIG. 4b illustrates 400b, which is a cross sectional image along a plane which is perpendicular to the fin 202 and which passes through the center of the gate stack 212. The strain inducing layer 210 is seen to reside within the width of the fin 202. Over the semiconductor body 200, enveloping the capping layer 210, resides the gate stack 212 which comprises an interfacial layer 212a, a high-k dielectric layer 212b and a gate metal 212c.

Figure 5:
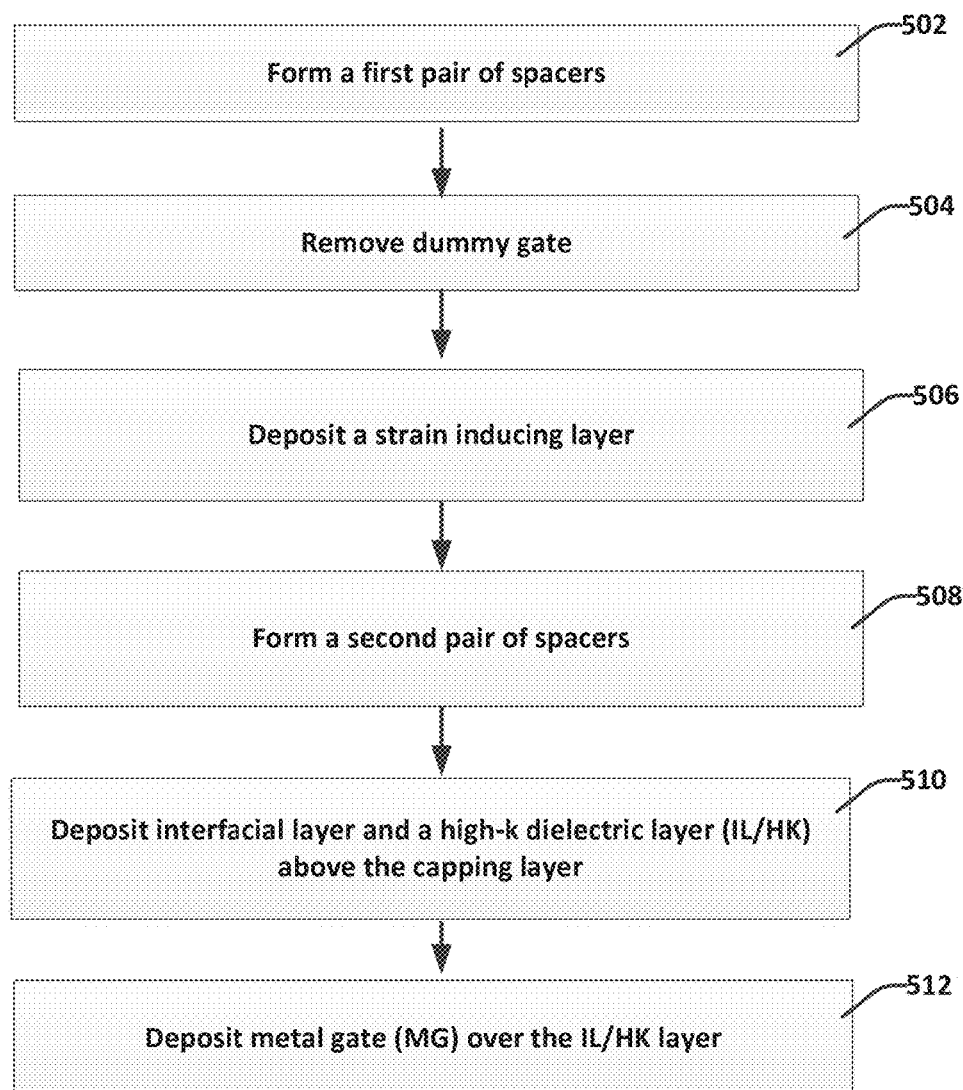
FIG. 5 illustrates a flow diagram of some embodiments of a method comprising forming a pair of spacers after the formation of a strain-inducing layer.

FIG. 5 illustrates a flow diagram of some embodiments of a method 500 comprising forming a pair of spacers after the formation of a strain inducing layer.

At 502, a first pair of spacers is formed on either side of a dummy gate. In some embodiments, the spacers are preferably composed of silicon dioxide ($SiO_2$), silicon oxynitride ($Si_x O_y N_z$), composite ($SiO_2/Si_3 N_4$), or most preferably silicon nitride ($Si_3 N_4$). They can be formed by a blanket deposition and isotropic etch back. The spacers preferably have a thickness of between about 1 nm and 5 nm.

At 504, the dummy gate is removed.

At 506, a strain inducing layer is formed over the fin in the gate opening.

At 508, a second pair of spacers is formed over the strain inducing layer vertically above the LDD regions (over-lapped by the strain inducing layer) in order to reduce capacitive coupling between the LDD regions and the gate electrode.

At 510, an interfacial layer (IL) and a high-k dielectric layer (HK) are deposited above the strain inducing or capping layer.

At 512, a metal gate (MG) is deposited over the high-k dielectric layer forming a gate electrode.

Figure 6A:
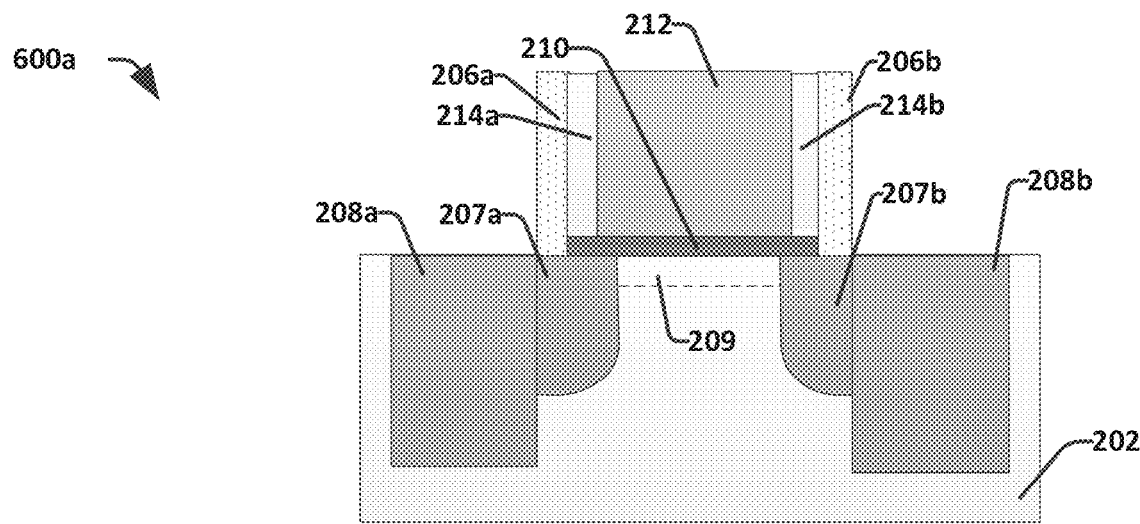
FIGS. 6A and 6B illustrate cross sectional images along two perpendicular planes of a finFET device comprising a strain-inducing layer and second pair of spacers.
Figure 6B:
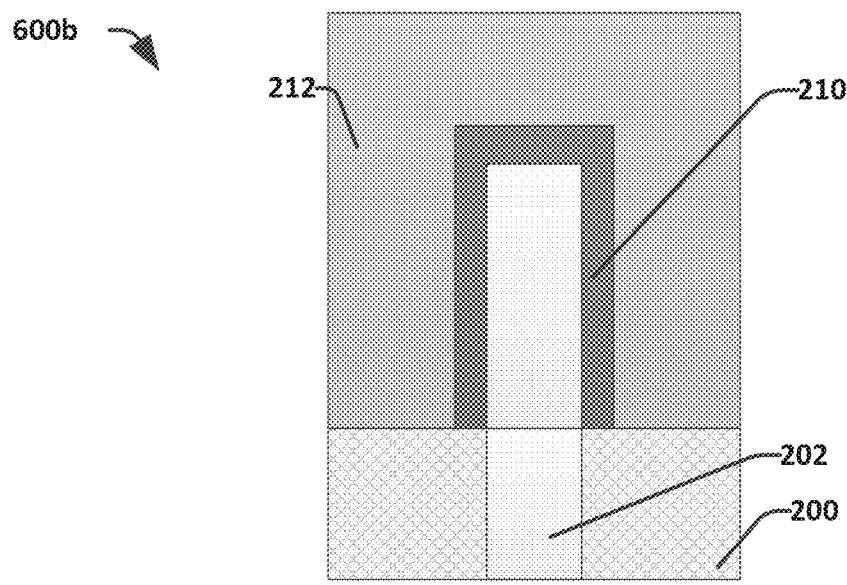

FIGS. 6a and 6b illustrate cross sectional images along two perpendicular planes of a finFET device comprising a strain inducing layer and second pair of spacers.

FIG. 6a illustrates 600a, which is a cross sectional image of a finFET device formed according to method 500. The cross section is along a plane which is parallel to the fin 202 and passes through the center of it. Semiconductor fin 202 comprises LDD regions 207a and 207b, source region 208a, drain region 208b and a carrier channel 209 disposed within the fin. Strain inducing layer 210 resides above the channel 209 and part of the LDD regions. A first pair of spacers 206a and 206b reside on either side of the cap layer above the distal ends of the LDD regions 207a and 207b. A second pair of spacers 214a and 214b reside above the strain inducing layer 210 at two end locations vertically above the LDD regions that are overlapped by the strain inducing layer. This is to reduce capacitive coupling between the LDD regions and the gate electrode. A gate stack 212 resides above the strain inducing layer 210 within the second pair of spacers 214a and 214b. In some embodiments, spacers 206a, 206b are un-doped and spacers 214a and 214b are doped. Doping the spacers would reduce the dielectric constant of gate spacers, and hence reduce the external resistance between the source and the drain regions. In some embodiments, the second pair of spacers 214a and 214b is subjected to dopants like Boron [B] at a concentration ranging between approximately 1e20 $cm^{-3}$ to 1e22 $cm^{-3}$. The width of the spacers ranges from approximately 1 to 5 nm.

FIG. 6b illustrates 600b, which is a cross sectional image along a plane which is perpendicular to the fin 202 and which passes through the center of the gate stack 212. In this case the strain inducing layer 210 resides outside the width of the fin 202 unlike the recessed fin case. Above the semiconductor body 200, resides the gate stack 212 which encompasses the strain inducing layer 210 and comprises an interfacial layer, a high-k dielectric layer and a gate metal.

Figure 7A:
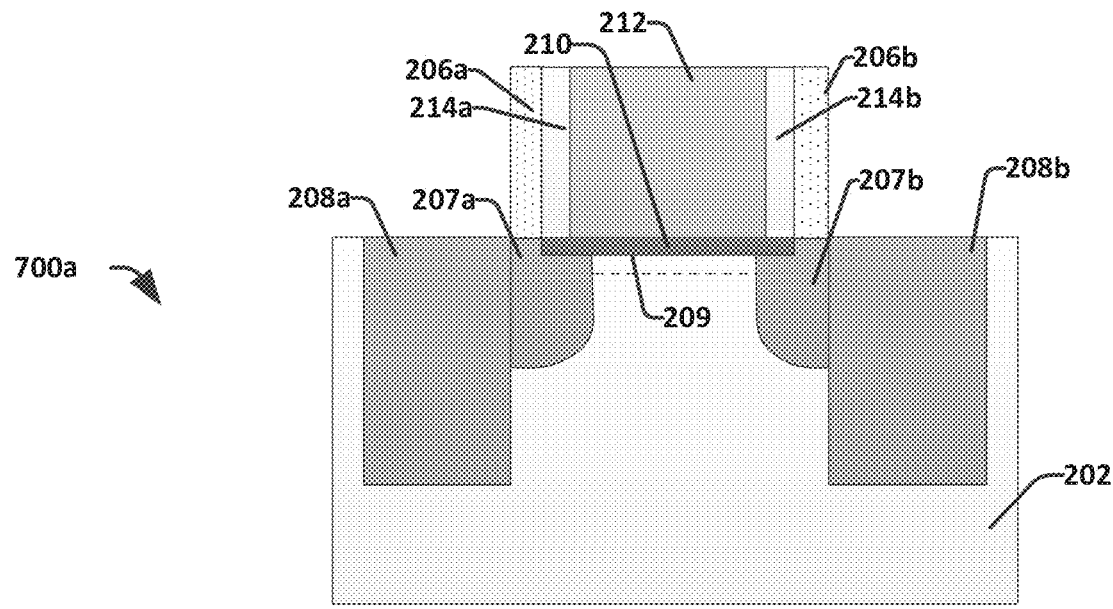
FIGS. 7A and 7B illustrate cross sectional images along two perpendicular planes of a finFET device comprising a strain-inducing layer over a recessed fin and, a second pair of spacers.

FIG. 7a illustrates an image 700a, which is a cross sectional image of a slightly different embodiment. The cross section is along a plane which is parallel to the fin 202 and passes through the center of it. In this embodiment, the device comprises two pairs of spacers similar to that illustrated in FIG. 6a, but they differ by the fact that 700a has a recessed fin in the gate region. Hence, the strain inducing layer 210 resides below the level of the bottom surface of all the spacers. The rest of the features are similar to that illustrated in FIG. 6a.

Figure 7B:
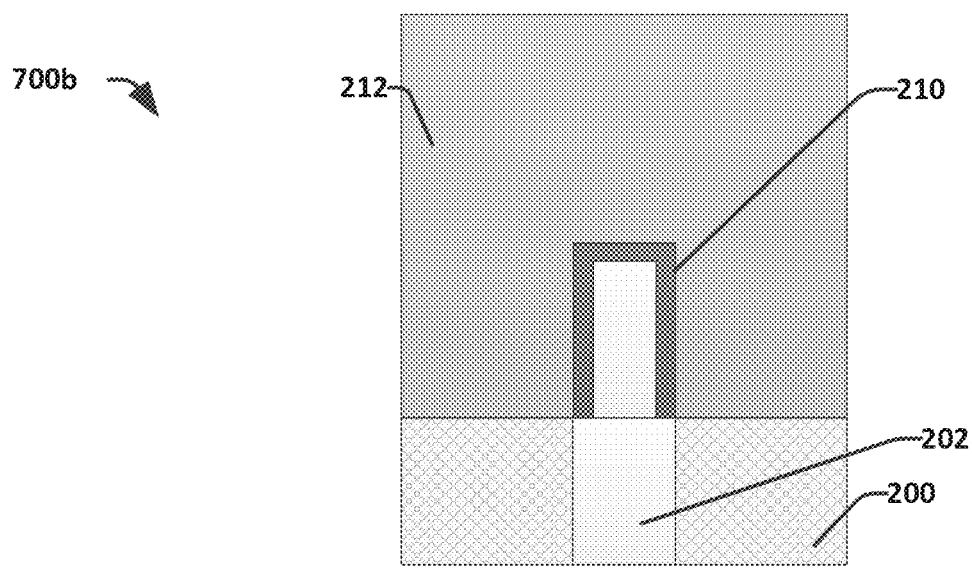

FIG. 7b illustrates a cross sectional image 700b which is a cross section along a plane perpendicular to the fin 202. Even though this embodiment illustrates a case with two pairs of spacers and a recessed fin, the cross section along this plane perpendicular to the fin 202, looks exactly the same as that illustrated in FIG. 4b.

Figure 8:
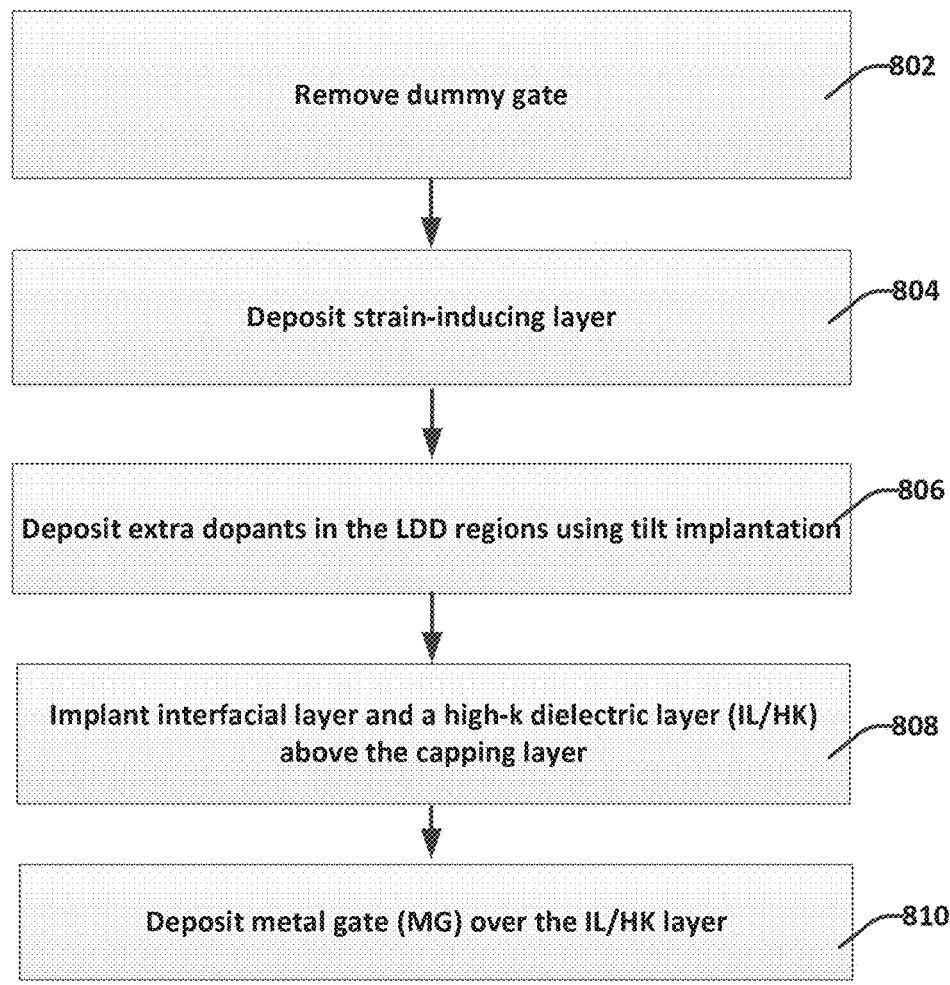
FIG. 8 illustrates a flow diagram of some embodiments of a method comprising tilt implantation in the LDD regions after formation of a strain-inducing layer.

FIG. 8 illustrates a flow diagram of some embodiments of a method 800 comprising tilt implantation in the LDD regions after formation of a strain inducing layer.

At 802, the dummy gate is removed leaving a gate opening. This step corresponds to step 110b of method 100.

At 804, a strain-inducing layer is formed over the fin in the gate opening.

At 806, extra dopants are implanted in the LDD regions using tilt implantation. Thermal processes taking place after formation of the source, drain and LDD regions tend to affect the dopant concentration in those regions, especially the lightly doped source and drain regions. This will affect the coupling between the gate and the channel established by the source and the drain regions or increase the source drain resistance. Tilt implantation in the LDD regions during the RPG stage, after formation of the strain inducing layer will help decrease the source drain resistance or external resistance. Thus, the extra dopants will help enhance device performance.

At 808, an interfacial layer (IL) and a high-k dielectric layer (HK) are deposited above the strain inducing or capping layer.

At 810, a metal gate (MG) is deposited over the high-k dielectric layer forming a gate electrode.

Figure 9:
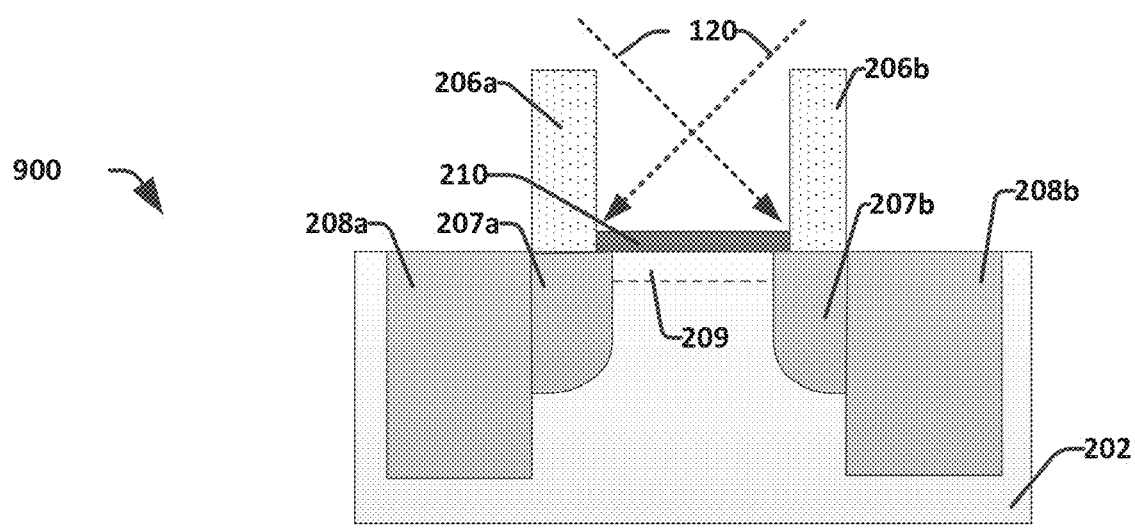
FIG. 9 illustrate a cross sectional image of a finFET device with an open gate region during tilt implantation.

FIG. 9 illustrates a cross sectional image 900 of a device formed according to method 800. The cross section is along a plane which is parallel to the fin 202. Dopant ions 120 are implanted in a tilted angle directing toward the LDD regions 207a and 207b. In some embodiments, dopants like boron [B] or difluroboron [BF2] at doses ranging between 1e14-2e15 cm$^{-2}$ are implanted in the LDD regions. The tilt angle and the energy of the implant ranges between T3-T45 and 0.5 KeV-10 KeV respectively. Source region 208a, drain region 208b and the carrier channel 209 are disposed within the semiconductor fin 202. The strain inducing layer 210 resides above the channel 209 in the gate region. Side wall spacers 206a and 206b resides on either side of the strain inducing layer 210 above the LDD regions 207a and 207b. The spacers 206a and 206b may be doped or un-doped.

Figure 10:
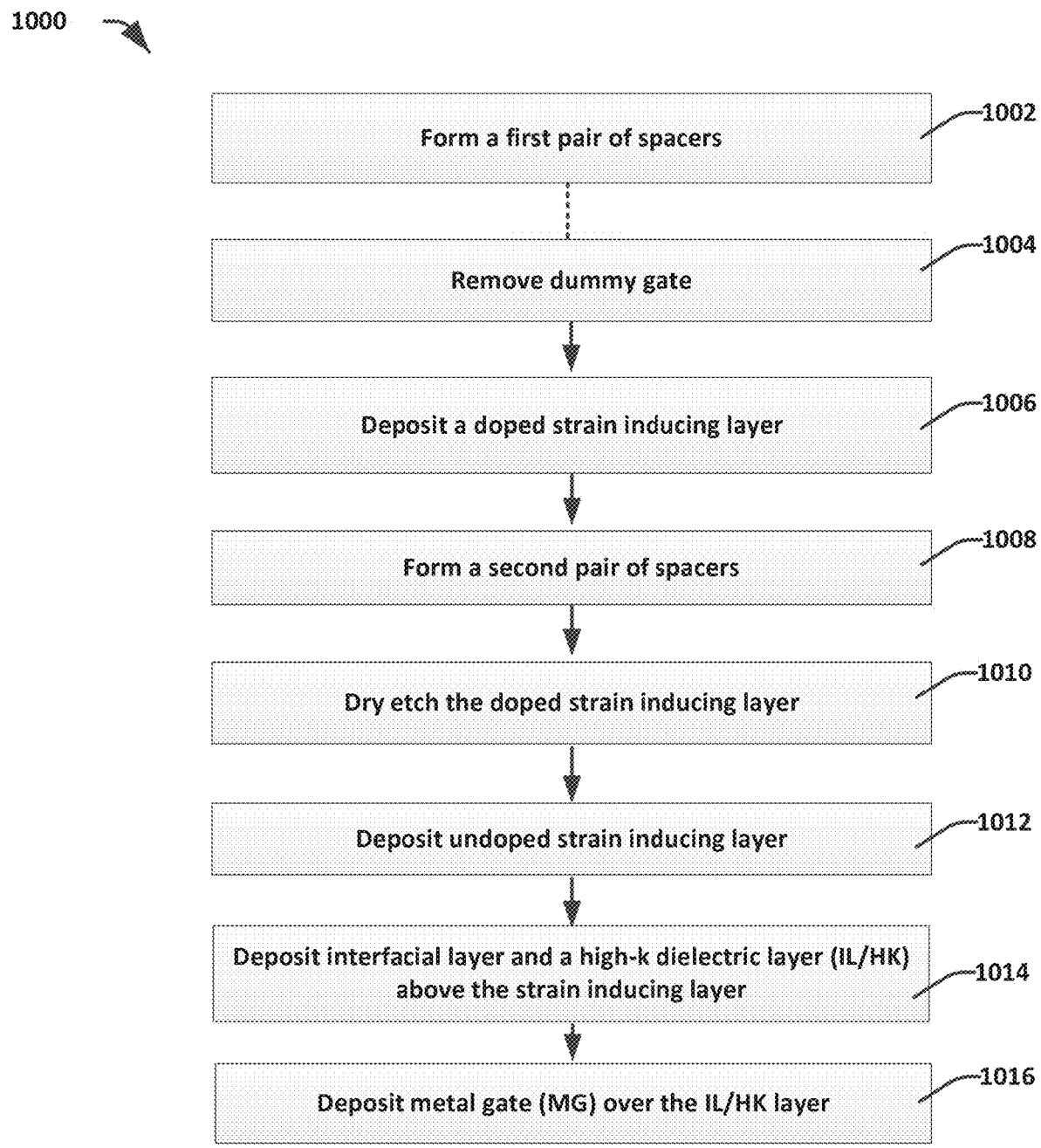
FIG. 10 illustrates a flow diagram of some embodiments of a method of forming a dual capping layer comprising a doped low resistance layer and an un-doped strain-inducing layer.

FIG. 10 illustrates a flow diagram of some embodiments of a method 1000 for forming a dual capping layer comprising a doped strain inducing layer and an un-doped strain-inducing layer.

At 1002, a first pair of spacers is formed on either side of a dummy gate.

At 1004, the dummy gate is removed forming a gate opening.

At 1006, a doped strain inducing layer is deposited in the gate opening. In some embodiments, the doped strain inducing layer comprises [B] dopant concentration ranging from 1e18 cm$^{-3}$-5e21 cm$^{-3}$. The thickness of the doped strain inducing layer ranges from approximately 1 nm-10 nm. The doped strain inducing layer above the LDD regions helps reduce the source drain external resistance.

At 1008, a second pair of spacers is formed above the doped strain inducing layer vertically above the LDD regions.

At 1010, the doped strain inducing layer is removed from the gate opening. In some embodiments this is done using dry etching or plasma etching.

At 1012, an un-doped strain inducing layer is deposited in the gate opening. In some embodiments, the thickness of the un-doped strain inducing layer ranges from approximately 1 nm-10 nm.

At 1108, an interfacial layer (IL) and a high-k dielectric layer (HK) are deposited above the un-doped strain inducing layer.

At 1110, a metal gate (MG) is deposited over the high-k dielectric layer forming a gate electrode.

Figure 11:
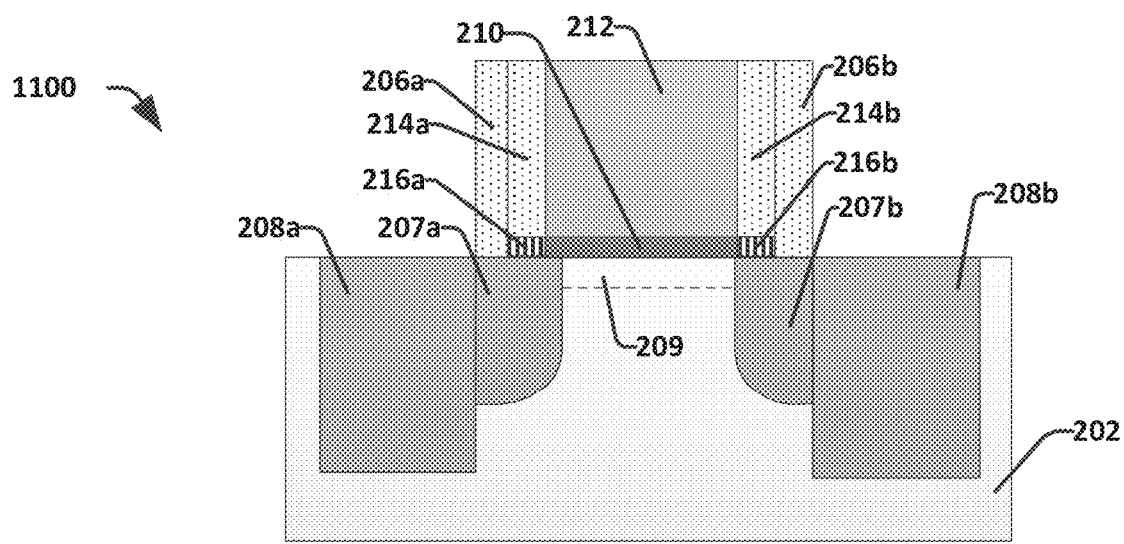
FIG. 11 illustrate a cross sectional image of a finFET device comprising a doped low resistance layer and an un-doped strain-inducing layer.

FIG. 11 illustrates an image 1100, which is a cross section along a plane parallel to the fin of a device, formed according to method 1000. Doped strain inducing regions 216a and 216b are seen under the second pair of spacers 214a and 214b. In this embodiment, both the first and second pairs of spacers are un-doped. The rest of the features are the same as that illustrated in FIG. 6a.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein The present disclosure relates to a method of forming a strain inducing layer or cap layer at the RPG stage of a finFET device formation process. This will prevent relaxation of the strain inducing layer because by this stage, the high temperature processes that cause the relaxation would be completed. Different types of doping techniques that helps in reducing the external resistance are also discussed in this disclosure.

In some embodiments, the present disclosure relates to a fin field-effect transistor (finFET) device. A semiconductor fin extends along a first direction and over a semiconductor substrate. A first source/drain region and a second source/drain region are disposed on or within the semiconductor fin, the first source/drain region being spaced apart along the first direction from the second source/drain region by a channel region. A metal gate electrode is straddling the channel region and extending along a second direction, the second direction different than the first direction. First and second spacers are disposed alongside and spaced apart along the first direction by the metal gate electrode, and wherein the first and second spacers have innermost sidewalls which are disposed along outer sidewalls of the metal gate electrode. A strain-inducing layer disposed over the channel region, wherein the strain-inducing layer has an upper surface that is even with or recessed below an uppermost surface of the semiconductor fin.

In another embodiment, the present disclosure relates to a fin field-effect transistor (finFET) device. A semiconductor fin extends along a first direction and over a semiconductor substrate. A first source/drain region and a second source/drain region are disposed on or within the semiconductor fin. The first source/drain region is spaced apart along the first direction from the second source/drain region by a channel region. A metal gate electrode straddles the channel region and is separated from the channel region by a gate dielectric. The metal gate electrode extends along a second direction different than the first direction. A strain-inducing layer is disposed on the semiconductor fin between the channel region and the metal gate electrode. First and second inner spacers are disposed on a top surface of the strain-inducing layer and having inner sidewalls disposed along outer sidewalls of the metal gate electrode, the inner sidewalls of the first and second inner spacers being normal to the first direction. First and second outer spacers have innermost sidewalls disposed along outer sidewalls of the first and second inner spacers, respectively. The first and second outer spacers covers outer sidewalls of the first and second inner spacers.

In yet another embodiment, the present disclosure relates to a fin field-effect transistor (finFET) device. A semiconductor fin extends along a first direction and over a semiconductor substrate. A first source/drain region and a second source/drain region are disposed on or within the semiconductor fin, the first source/drain region being spaced apart along the first direction from the second source/drain region by a channel region. A metal gate electrode straddles the channel region and extends along a second direction, the second direction different than the first direction. First and second spacers are disposed over the first and second source/drain extension regions, respectively. The first and second spacers are spaced apart along the first direction by the metal gate electrode, and the first and second spacers have innermost sidewalls which are disposed along outer sidewalls of the metal gate electrode. A strain-inducing layer is disposed over the channel region. The strain-inducing layer has an upper surface that is even with or recessed below an uppermost surface of the semiconductor fin.

What is claimed is:

1. A fin field-effect transistor (FinFET), comprising:
   a semiconductor fin extending along a first direction and over a semiconductor substrate;
   a first source/drain region and a second source/drain region disposed on or within the semiconductor fin, the first source/drain region being spaced apart along the first direction from the second source/drain region by a channel region;
   a metal gate electrode straddling the channel region and extending along a second direction, the second direction different than the first direction;
   first and second spacers disposed alongside and spaced apart along the first direction by the metal gate electrode, and wherein the first and second spacers have innermost sidewalls which are disposed along outer sidewalls of the metal gate electrode; and
   a strain-inducing layer disposed over the channel region, wherein the strain-inducing layer has an upper surface that is even with or recessed below an uppermost surface of the semiconductor fin.

2. The FinFET of claim 1, wherein the innermost sidewalls of the first and second spacers are aligned with outermost sidewalls of the strain-inducing layer.

3. The FinFET of claim 1, further comprising:
   first and second source/drain extension regions being arranged on opposite sides of the channel region, the first source/drain extension region disposed between the first source/drain region and the channel region, and the second source/drain extension region disposed between the channel region and the second source/drain region;
   wherein bottom surfaces of the first and second spacers rest on upper surfaces of the first and second source/drain extension regions, respectively.

4. The FinFET of claim 3, wherein outer sidewalls of the first and second spacers are spaced apart from innermost regions of the first and second source/drain regions, such that the first spacer has a width that is less than a width of the first source/drain extension region.

5. The FinFET of claim 3, wherein the innermost sidewalls of the first and second spacers are aligned with innermost regions of the first and second source/drain extension regions, respectively.

6. The FinFET of claim 3, wherein the strain-inducing layer is an un-doped region under the metal gate electrode; the FinFET further comprising:
   a doped region between the first and second source/drain extension regions and the first and second spacers, wherein inner sidewalls of the doped region contact outermost sidewalls of the strain-inducing layer.

7. The FinFET of claim 6, wherein the strain-inducing layer has a lower surface that is co-planar with an upper surface of the semiconductor fin, and the outermost sidewalls of the strain-inducing layer are aligned with the innermost sidewalls of the first and second spacers.

8. A fin field-effect transistor (FinFET), comprising:
   a semiconductor fin extending along a first direction and over a semiconductor substrate;
   a first source/drain region and a second source/drain region disposed on or within the semiconductor fin, the first source/drain region being spaced apart along the first direction from the second source/drain region by a channel region;
   a metal gate electrode straddling the channel region and being separated from the channel region by a gate dielectric, the metal gate electrode extending along a second direction different than the first direction;
   a strain-inducing layer disposed on the semiconductor fin between the channel region and the metal gate electrode;
   first and second inner spacers disposed on a top surface of the strain-inducing layer and having inner sidewalls disposed along outer sidewalls of the metal gate electrode, the inner sidewalls of the first and second inner spacers being normal to the first direction; and
   first and second outer spacers disposed along outer sidewalls of the first and second inner spacers, respectively, wherein the first and second outer spacers cover outer sidewalls of the strain-inducing layer.

9. The FinFET of claim 8, further comprising:
   first and second source/drain extension regions being arranged on opposite sides of the channel region, the first source/drain extension region disposed between the first source/drain region and the channel region, and the second source/drain extension region disposed between the channel region and the second source/drain region;
   wherein the inner sidewalls of the first and second inner spacers are aligned with innermost regions of the first and second source/drain extension regions, respectively.

10. The FinFET of claim 8, wherein outer sidewalls of the first and second outer spacers have outermost sidewalls between innermost sidewalls of the first and second outer spacers.

11. The FinFET of claim 8, wherein the first and second inner spacers are doped with n-type or p-type impurities while the first and second outer spacers are un-doped.

12. The FinFET of claim 8, wherein the strain-inducing layer comprises an un-doped center portion disposed within the inner sidewalls of the first and second inner spacers.

13. The FinFET of claim 12, wherein the strain-inducing layer further comprises a doped boundary portion disposed directly under the first and second inner spacers.

14. The FinFET of claim 8, wherein the gate dielectric is disposed over the strain-inducing layer, and the strain-inducing layer has an upper surface that is aligned with an uppermost surface of the semiconductor fin.

15. The FinFET of claim 8, wherein the strain-inducing layer has a lower surface that is co-planar with an upper surface of the semiconductor fin, and has outermost sidewalls that are aligned with innermost sidewalls of the first and second inner spacers.

16. A fin field-effect transistor (finFET) device comprising:
    a semiconductor fin extending along a first direction and above a semiconductor substrate;
    a source region and a drain region within the semiconductor fin, wherein the source region and the drain region are spaced apart in the first direction;
    first and second lightly doped drain (LDD) regions which are arranged within the semiconductor fin and which abut innermost side walls of the source and the drain regions, respectively;
    a channel region connecting the first and second LDD regions;
    a pair of spacers above the first and second LDD regions, the pair of spacers having innermost sidewalls that are normal to the first direction, wherein a first spacer of the pair of spacers is above the first LDD region and a second spacer of the pair of spacers is above the second LDD region;
    a strain-inducing layer over an upper surface of the channel region, wherein the strain-inducing layer has outermost sidewalls that are aligned with innermost sidewalls of the pair of spacers; and
    a replacement gate stack abutting a top surface of the strain-inducing layer.

17. The finFET device of claim 16, wherein the upper surface of the channel region on which the strain-inducing layer is formed is recessed relative to a top surface of the semiconductor fin.

18. The FinFET of claim 16, wherein the strain-inducing layer comprises an un-doped center portion disposed within the inner sidewalls of the pair of spacers and a doped boundary portion disposed directly under the pair of spacers.

19. The finFET device of claim 16, wherein the replacement gate stack comprises:
    an interfacial layer arranged over the channel region;
    a high-k dielectric layer arranged over the interfacial layer; and
    a metal gate electrode arranged over the high-k dielectric layer.

20. The finFET device of claim 16, further comprising an additional pair of spacers, wherein the pair of spacers for the FinFET device is doped and the additional pair of spacers for the FinFET device is un-doped.

* * * * *